(12) United States Patent
Geshi et al.

(10) Patent No.: US 10,340,886 B2
(45) Date of Patent: Jul. 2, 2019

(54) CERAMIC SUBSTRATE, LAYERED BODY, AND SAW DEVICE

(71) Applicant: SUMITOMO ELECTRIC INDUSTRIES, LTD., Osaka-shi, Osaka (JP)

(72) Inventors: Keiichiro Geshi, Osaka (JP); Shigeru Nakayama, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 413 days.

(21) Appl. No.: 15/317,563

(22) PCT Filed: Apr. 26, 2016

(86) PCT No.: PCT/JP2016/062959
§ 371 (c)(1),
(2) Date: Dec. 9, 2016

(87) PCT Pub. No.: WO2016/159393
PCT Pub. Date: Oct. 6, 2016

(65) Prior Publication Data
US 2017/0279435 A1    Sep. 28, 2017

(30) Foreign Application Priority Data

Mar. 22, 2016 (JP) ................................. 2016-057300

(51) Int. Cl.
*H03H 9/25* (2006.01)
*C04B 35/111* (2006.01)
(Continued)

(52) U.S. Cl.
CPC ............... *H03H 9/25* (2013.01); *B32B 9/005* (2013.01); *B32B 18/00* (2013.01); *C04B 35/053* (2013.01);
(Continued)

(58) Field of Classification Search
CPC ........ H03H 9/25; H03H 3/08; H03H 9/02543; H03H 9/02559; H03H 9/02574;
(Continued)

(56) References Cited

U.S. PATENT DOCUMENTS 9,469,571 B2 * 10/2016 Iwasaki .................. B32B 18/00
10,134,589 B2 * 11/2018 Odnoblyudov ....... C23C 16/401
(Continued)

FOREIGN PATENT DOCUMENTS

JP    H07-122960 A    5/1995
JP    H11-116397 A    4/1999
(Continued)

*Primary Examiner* — J. San Martin
(74) *Attorney, Agent, or Firm* — Drinker Biddle & Reath LLP (57) ABSTRACT

A ceramic substrate is formed of a polycrystalline ceramic and has a supporting main surface. The supporting main surface has a roughness of 0.01 nm or more and 3.0 nm or less in terms of Sa. The number of projections and depressions with a height of 1 nm or more in a square region with 50 μm sides on the supporting main surface is less than 5 on average, and the number of projections and depressions with a height of 2 nm or more in the square region is less than 1 on average.

6 Claims, 3 Drawing Sheets

(51) Int. Cl.
*B32B 9/00* (2006.01)
*H03H 9/02* (2006.01)
*H03H 9/05* (2006.01)
*H03H 9/08* (2006.01)
*H03H 3/08* (2006.01)
*B32B 18/00* (2006.01)
*C04B 35/053* (2006.01)
*C04B 35/057* (2006.01)
*C04B 35/14* (2006.01)
*C04B 35/185* (2006.01)
*C04B 35/195* (2006.01)
*C04B 35/443* (2006.01)
*C04B 35/46* (2006.01)
*C04B 35/495* (2006.01)
*C04B 35/565* (2006.01)
*C04B 35/581* (2006.01)
*C04B 35/587* (2006.01)

(52) U.S. Cl.
CPC .......... *C04B 35/057* (2013.01); *C04B 35/111* (2013.01); *C04B 35/14* (2013.01); *C04B 35/185* (2013.01); *C04B 35/195* (2013.01); *C04B 35/443* (2013.01); *C04B 35/46* (2013.01); *C04B 35/495* (2013.01); *C04B 35/565* (2013.01); *C04B 35/581* (2013.01); *C04B 35/587* (2013.01); *H03H 3/08* (2013.01); *H03H 9/02543* (2013.01); *H03H 9/02559* (2013.01); *H03H 9/02574* (2013.01); *H03H 9/02669* (2013.01); *H03H 9/058* (2013.01); *H03H 9/08* (2013.01); *B32B 2307/20* (2013.01); *B32B 2457/00* (2013.01); *C04B 2235/3203* (2013.01); *C04B 2235/963* (2013.01); *C04B 2237/34* (2013.01); *C04B 2237/341* (2013.01); *C04B 2237/343* (2013.01); *C04B 2237/345* (2013.01)

(58) Field of Classification Search
CPC ...... H03H 9/02669; H03H 9/058; H03H 9/08; B32B 9/005; B32B 18/00; B32B 2307/20; B32B 2457/00; C04B 35/053; C04B 35/057; C04B 35/111; C04B 35/14; C04B 35/185; C04B 35/195; C04B 35/443; C04B 35/46; C04B 35/495; C04B 35/565; C04B 35/581; C04B 35/587; C04B 2235/3203; C04B 2235/963; C04B 2237/341; C04B 2237/34; C04B 2237/343; C04B 2237/345

See application file for complete search history.

(56) References Cited

U.S. PATENT DOCUMENTS

| | | | | |
|---|---|---|---|---|
| 2008/0303118 | A1* | 12/2008 | Arena | H01L 21/76254 257/615 |
| 2010/0187949 | A1* | 7/2010 | Pahl | H03H 9/02574 310/313 R |
| 2010/0252950 | A1* | 10/2010 | Yoshimura | C04B 35/443 264/133 |
| 2015/0065012 | A1* | 3/2015 | McArdle | B24B 7/22 451/41 |
| 2015/0183179 | A1* | 7/2015 | Frank | B22D 19/0081 428/192 |
| 2015/0194442 | A1* | 7/2015 | Ishibashi | H01L 21/76251 428/137 |
| 2016/0375607 | A1* | 12/2016 | Badding | B28B 11/243 428/220 |
| 2018/0005847 | A1* | 1/2018 | Fagan | B29C 66/73 |
| 2019/0007022 | A1* | 1/2019 | Goto | H03H 9/02559 |

FOREIGN PATENT DOCUMENTS

| | | |
|---|---|---|
| JP | 2011-066818 A | 3/2011 |
| WO | WO-2011/034136 A1 | 3/2011 |
| WO | WO-2012/033125 A1 | 3/2012 |
| WO | WO-2014/027538 A1 | 2/2014 |
| WO | WO-2015/186560 A1 | 12/2015 |

* cited by examiner

CERAMIC SUBSTRATE, LAYERED BODY, AND SAW DEVICE

TECHNICAL FIELD

The present invention relates to a ceramic substrate, a layered body, and a SAW device. More specifically, the present invention relates to a ceramic substrate suitable for supporting a piezoelectric substrate, a layered body including the piezoelectric substrate and the ceramic substrate, and a SAW device including the layered body.

BACKGROUND ART

SAW devices (surface acoustic wave devices) are installed in communication apparatuses such as cellular phones in order to remove noises included in electric signals. SAW devices have a function of extracting only electric signals having a desired frequency among input electric signals. SAW devices have a structure in which electrodes are formed on a piezoelectric substrate. To dissipate heat during operation, the piezoelectric substrate is disposed on a base substrate made of a material with good heat dissipation properties.

For example, a substrate made of single-crystalline sapphire can be employed as the base substrate. However, if such a substrate made of single-crystalline sapphire is employed as the base substrate, the production cost of SAW devices increases. To address this problem, there has been proposed a SAW device having a structure in which a ceramic substrate made of polycrystalline spinel is employed as a base substrate, and a piezoelectric substrate and a ceramic substrate whose surface roughness Ra (arithmetic mean roughness) is decreased are bonded to each other through Van der Waals force. Thus, the production cost of SAW devices can be reduced (e.g., refer to PTL 1).

CITATION LIST

Patent Literature

PTL 1: Japanese Unexamined Patent Application Publication No. 2011-66818

SUMMARY OF INVENTION

A ceramic substrate according to this disclosure is formed of a polycrystalline ceramic and has a supporting main surface. The supporting main surface has a roughness of 0.01 nm or more and 3.0 nm or less in terms of Sa. The number of projections and depressions with a height of 1 nm or more in a square region with 50 μm sides on the supporting main surface is less than 5 on average, and the number of projections and depressions with a height of 2 nm or more in the square region is less than 1 on average.

DESCRIPTION OF EMBODIMENTS

Problems to be Solved by the Disclosure

To further decrease the production cost of SAW devices, there is a demand for further increasing the bonding strength between a piezoelectric substrate and a ceramic substrate. Accordingly, it is an object to provide a ceramic substrate that can be bonded to a piezoelectric substrate with sufficient bonding strength, a layered body including a piezoelectric substrate and a ceramic substrate bonded to each other with sufficient bonding strength, and a SAW device including the layered body.

Advantageous Effects of the Disclosure

According to the above ceramic substrate, there can be provided a ceramic substrate that can be bonded to a piezoelectric substrate with sufficient bonding strength.

DESCRIPTION OF EMBODIMENTS OF THE PRESENT INVENTION

First, embodiments of the present invention will be listed and described. A ceramic substrate according to the present application is formed of a polycrystalline ceramic and has a supporting main surface. The supporting main surface has a roughness of 0.01 nm or more and 3.0 nm or less in terms of Sa. The number of projections and depressions with a height of 1 nm or more in a square region with 50 μm sides on the supporting main surface is less than 5 on average, and the number of projections and depressions with a height of 2 nm or more in the square region is less than 1 on average.

The present inventors have conducted studies on causes of insufficient bonding strength that sometimes occurs when a piezoelectric substrate and a ceramic substrate (base substrate) having a surface whose arithmetic mean roughness is decreased are bonded to each other through Van der Waals force. As a result, they have found that even if the roughness is sufficiently decreased in terms of arithmetic mean roughness, sufficient bonding strength is not achieved in the case where large projections and depressions are present, such as the case where the number of projections and depressions with a height of 1 nm or more in a square region with 50 μm sides is 5 or more or the case where the number of projections and depressions with a height of 2 nm or more in a square region with 50 μm sides is 1 or more. That is, to achieve sufficient bonding strength, the roughness is sufficiently decreased in terms of arithmetic mean roughness (in terms of mean roughness), and furthermore the number of large projections and depressions present in some rare cases as above needs to be decreased.

In the ceramic substrate according to the present application, the supporting main surface has a roughness of 0.01 nm or more and 3.0 nm or less in terms of Sa, and thus the surface roughness is sufficiently decreased in terms of arithmetic mean roughness. Furthermore, in the ceramic substrate according to the present application, the number of projections and depressions with a height of 1 nm or more in a square region with 50 μm sides on the supporting main surface is less than 5 on average, and the number of projections and depressions with a height of 2 nm or more in the square region is less than 1 on average. That is, in the ceramic substrate according to the present application, the roughness of the supporting main surface is sufficiently decreased in terms of arithmetic mean roughness, and furthermore the number of large projections and depressions present on the supporting main surface in some rare cases is decreased. Thus, according to the ceramic substrate of the present application, there can be provided a ceramic substrate that can be bonded to a piezoelectric substrate with sufficient bonding strength.

In the above ceramic substrate, the supporting main surface may have a roughness of 0.5 nm or less in terms of Sq. This provides sufficient bonding strength between the ceramic substrate and the piezoelectric substrate with more certainty.

The above ceramic substrate may be formed of a polycrystalline ceramic made of at least one material selected from the group consisting of spinel ($MgAl_2O_4$), alumina ($Al_2O_3$), magnesia (MgO), silica ($SiO_2$), mullite ($3Al_2O_3 \cdot 2SiO_2$), cordierite ($2MgO \cdot 2Al_2O_3 \cdot 5SiO_2$), calcia (CaO), titania ($TiO_2$), silicon nitride ($Si_3N_4$), aluminum nitride (AlN), and silicon carbide (SiC). These materials are suitable for the ceramic substrate according to the present application.

A layered body according to the present application includes the above ceramic substrate and a piezoelectric substrate disposed on the supporting main surface and formed of a piezoelectric body. The ceramic substrate and the piezoelectric substrate are bonded to each other through Van der Waals force.

In the layered body according to the present application, the ceramic substrate in which the roughness of the supporting main surface is sufficiently decreased in terms of arithmetic mean roughness and furthermore the number of large projections and depressions present on the supporting main surface in some rare cases is decreased and a piezoelectric substrate are bonded to each other through Van der Waals force. Therefore, according to the layered body of the present application, there can be provided a layered body including a piezoelectric substrate and a ceramic substrate bonded to each other with sufficient bonding strength.

In the above layered body, the bonding strength between the ceramic substrate and the piezoelectric substrate may be 0.5 $J/m^2$ or more. Thus, the piezoelectric substrate and the ceramic substrate are bonded to each other with more certainty. If the bonding strength between the piezoelectric substrate and the ceramic substrate is less than 0.5 $J/m^2$, for example, separation and chipping of the substrates may occur in an electrode forming step or a chip forming step performed in the production of SAW devices. To bond the piezoelectric substrate and the ceramic substrate to each other with more certainty, the bonding strength between the ceramic substrate and the piezoelectric substrate is preferably 1.0 $J/m^2$ or more, more preferably 1.3 $J/m^2$ or more, and further preferably 1.5 $J/m^2$ or more.

A SAW device according to the present application includes the layered body according to the present application and an electrode formed on a main surface of the piezoelectric substrate, the main surface being located opposite to the ceramic substrate. The SAW device according to the present application includes the layered body according to the present application in which the piezoelectric substrate and the ceramic substrate formed of a polycrystalline ceramic are bonded to each other with sufficient bonding strength. Therefore, there can be provided a SAW device in which the piezoelectric substrate and the ceramic substrate are bonded to each other with sufficient bonding strength while the production cost is reduced.

Herein, the roughness Sa, Sq, and Sz refer to arithmetic mean height Sa, root mean square height Sq, and maximum height Sz conforming to ISO 25178, respectively. These surface roughness parameters can be measured by using, for example, a three-dimensional surface roughness tester.

DETAILS OF EMBODIMENTS OF THE PRESENT INVENTION

Next, a ceramic substrate and a layered body according to embodiments of the present invention will be described below with reference to the attached drawings. In these drawings, the same or corresponding components are denoted by the same reference numerals and repetitive descriptions thereof are omitted.

Figure 1:
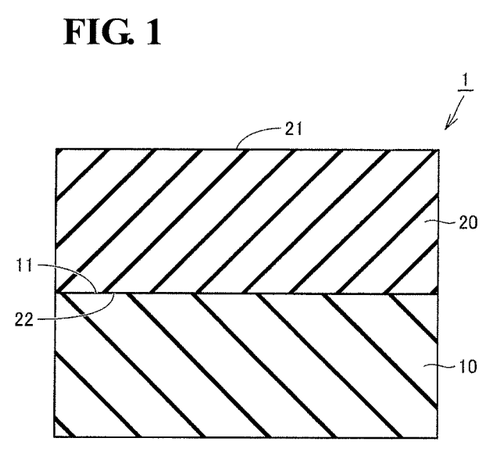
FIG. 1 is a schematic sectional view illustrating a structure of a layered body including a ceramic substrate and a piezoelectric substrate.

Referring to FIG. 1, a layered body 1 according to this embodiment includes a base substrate 10 serving as a ceramic substrate and a piezoelectric substrate 20. The piezoelectric substrate 20 is formed of a piezoelectric body made of, for example, lithium tantalate ($LiTaO_3$) or lithium niobate ($LiNbO_3$). The base substrate 10 is formed of a polycrystalline ceramic made of at least one selected from the group consisting of spinel, alumina, magnesia, silica, mullite, cordierite, calcia, titania, silicon nitride, aluminum nitride, and silicon carbide and is preferably formed of a polycrystalline ceramic made of one of the foregoing materials.

The base substrate 10 has a supporting main surface 11. The piezoelectric substrate 20 has an exposed main surface 21 and a bonding main surface 22 located opposite to the exposed main surface 21. The piezoelectric substrate 20 is disposed on the supporting main surface 11 of the base substrate 10 so that the bonding main surface 22 is in contact with the supporting main surface 11. The base substrate 10 and the piezoelectric substrate 20 are bonded to each other through Van der Waals force.

The supporting main surface 11 of the base substrate 10 has a roughness of 0.01 nm or more and 3.0 nm or less in terms of Sa. Furthermore, the number of projections and depressions with a height of 1 nm or more in a square region with 50 μm sides on the supporting main surface 11 is less than 5 on average, and the number of projections and depressions with a height of 2 nm or more in the square region is less than 1 on average.

In the layered body 1, when the supporting main surface 11 has a roughness of 0.01 nm or more and 3.0 nm or less in terms of Sa, the surface roughness is sufficiently decreased in terms of arithmetic mean roughness. In the layered body 1, the number of projections and depressions with a height of 1 nm or more in a square region with 50 μm sides on the supporting main surface 11 is less than 5 on average, and the number of projections and depressions with a height of 2 nm or more in the square region is less than 1 on average. That is, in the layered body 1, the roughness is sufficiently decreased in terms of arithmetic mean roughness, and furthermore the number of large projections and depressions present in some rare cases is decreased. Consequently, the layered body 1 is a layered body in which the piezoelectric substrate 20 and the base substrate 10 are bonded to each other with sufficient bonding strength.

In the present application, the projections and depressions with a height of 1 nm or more refer to projections and depressions with a distance of 1 nm or more from a mean plane (mean height) calculated in a measurement region (square region with 50 µm sides) to the top (or bottom). Similarly, the projections and depressions with a height of 2 nm or more refer to projections and depressions with a distance of 2 nm or more from a mean plane (mean height) calculated in a measurement region (square region with 50 µm sides) to the top (or bottom). The number of projections and depressions are counted with a microscope or the like in a plurality of measurement regions (square regions with 50 µm sides) on the supporting main surface 11, and the average of the numbers is defined as the number of projections and depressions on average.

To achieve sufficient bonding strength between the piezoelectric substrate 20 and the base substrate 10 with more certainty, the roughness of the supporting main surface is preferably set to 2.0 nm or less and more preferably 1.0 nm or less in terms of Sa. The number of projections and depressions with a height of 1 nm or more in the square region with 50 µm sides on the supporting main surface 11 is preferably less than 4, more preferably less than 3, and further preferably less than 2 on average.

The supporting main surface 11 preferably has a roughness of 0.5 nm or less in terms of Sq. This achieves sufficient bonding strength between the piezoelectric substrate 20 and the base substrate 10 with more certainty.

The bonding strength between the base substrate 10 and the piezoelectric substrate 20 is preferably 0.5 J/m² or more. Thus, the piezoelectric substrate 20 and the base substrate 10 are bonded to each other with more certainty.

Figure 2:
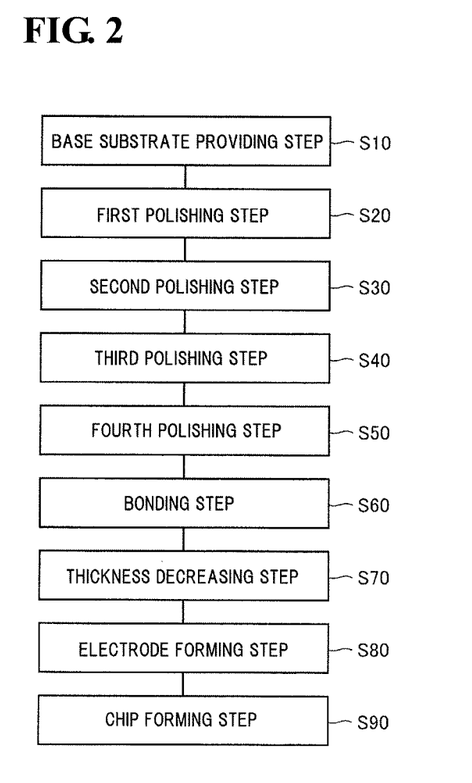
FIG. 2 is a flowchart schematically illustrating a method for producing a ceramic substrate, a layered body, and a SAW device.
Figure 3:
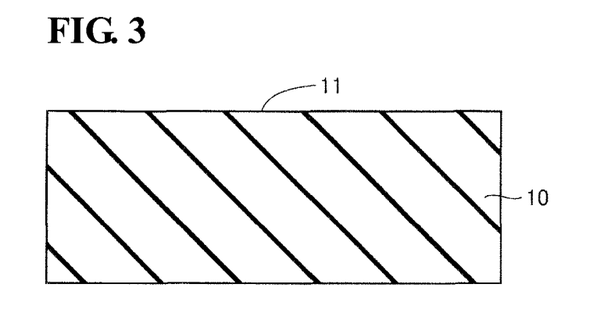
FIG. 3 is a schematic sectional view for describing the method for producing a ceramic substrate, a layered body, and a SAW device.

Next, a method for producing a base substrate 10 serving as a ceramic substrate, a layered body 1, and a SAW device including the layered body 1 according to this embodiment will be described. Referring to FIG. 2, in the method for producing a base substrate 10, a layered body 1, and a SAW device according to this embodiment, a base substrate providing step is performed as a step (S10). In the step (S10), as illustrated in FIG. 3, there is provided a base substrate 10 formed of a polycrystalline ceramic made of at least one material selected from the group consisting of spinel, alumina, magnesia, silica, mullite, cordierite, calcia, titania, silicon nitride, aluminum nitride, and silicon carbide. For example, a base substrate 10 formed of a polycrystalline ceramic made of one of the foregoing materials is provided. Specifically, for example, when a base substrate 10 formed of polycrystalline spinel is provided, a raw material powder is prepared by mixing magnesia powder and alumina powder, and a molded body is produced by molding the raw material powder. The molded body can be produced by, for example, performing preforming by press molding and then performing CIP (cold isostatic pressing). Subsequently, the molded body is subjected to sintering treatment. The sintering treatment can be performed by a method such as vacuum sintering or HIP (hot isostatic pressing). Thus, a sintered body is obtained. The sintered body is then subjected to dicing to obtain a base substrate 10 having a desired shape (thickness) (refer to FIG. 3).

Subsequently, a first polishing step is performed as a step (S20). In the step (S20), as illustrated in FIG. 3, rough polishing is performed on a supporting main surface 11 of the base substrate 10 provided in the step (S10). Specifically, rough polishing is performed on the supporting main surface 11 using, for example, a GC (green silicon carbide) wheel with #800 to #2000 abrasive grains.

Subsequently, a second polishing step is performed as a step (S30). In the step (S30), normal polishing is performed on the supporting main surface 11 on which the rough polishing has been performed in the step (S20). Specifically, normal polishing is performed on the supporting main surface 11 using, for example, a diamond wheel with abrasive grains having a grain size of 3 to 5 µm.

Subsequently, a third polishing step is performed as a step (S40). In the step (S40), finishing polishing is performed on the supporting main surface 11 on which the normal polishing has been performed in the step (S30). Specifically, finishing polishing is performed on the supporting main surface 11 using, for example, diamond abrasive grains with a grain size of 0.5 to 1.0 µm. This provides a supporting main surface 11 with a roughness of 0.01 nm or more and 3.0 nm or less in terms of Sa. However, scratches are formed on the supporting main surface 11 because of use of diamond abrasive grains. On the supporting main surface 11, therefore, a roughness of 0.01 nm or more and 3.0 nm or less in terms of Sa is achieved, but large projections and depressions due to scratches are present.

Subsequently, a fourth polishing step is performed as a step (S50). In the step (S50), scratch removing polishing is performed on the supporting main surface 11 on which the finishing polishing has been performed in the step (S40). Specifically, for example, CMP (chemical mechanical polishing) is performed on the supporting main surface 11 so that the supporting main surface 11 is slightly polished. The thickness with which the supporting main surface 11 is polished by CMP is about several hundred nanometers. Thus, a roughness of 0.01 nm or more and 3.0 nm or less in terms of Sa can be maintained on the supporting main surface 11. At the same time, the number of projections and depressions with a height of 1 nm or more in a square region with 50 µm sides on the supporting main surface 11 can be controlled to less than 5 on average, and the number of projections and depressions with a height of 2 nm or more in the square region can be controlled to less than 1 on average. Consequently, a base substrate 10 serving as a ceramic substrate according to this embodiment is completed.

Subsequently, a bonding step is performed as a step (S60). In the step (S60), the base substrate 10 whose supporting main surface 11 has been polished in the steps (S20) to (S50) and a separately provided piezoelectric substrate 20 are bonded to each other. Specifically, as illustrated in FIG. 3 and FIG. 1, a piezoelectric substrate 20 formed of a piezoelectric body made of, for example, lithium tantalate or lithium niobate is provided, and the base substrate 10 and the piezoelectric substrate 20 are bonded to each other so that a bonding main surface 22 of the piezoelectric substrate 20 is brought into contact with the supporting main surface 11 of the base substrate 10. Thus, the base substrate 10 and the piezoelectric substrate 20 bond to each other through Van der Waals force. Consequently, a layered body 1 according to this embodiment is obtained.

In this embodiment, the roughness of the supporting main surface 11 is sufficiently decreased in terms of arithmetic mean roughness, and furthermore the number of large projections and depressions (scratches) present on the supporting main surface 11 in some rare cases is decreased. Consequently, according to the method for producing a layered body 1, a layered body 1 in which the piezoelectric substrate 20 and the base substrate 10 are bonded to each other with sufficient bonding strength is produced.

Figure 4:
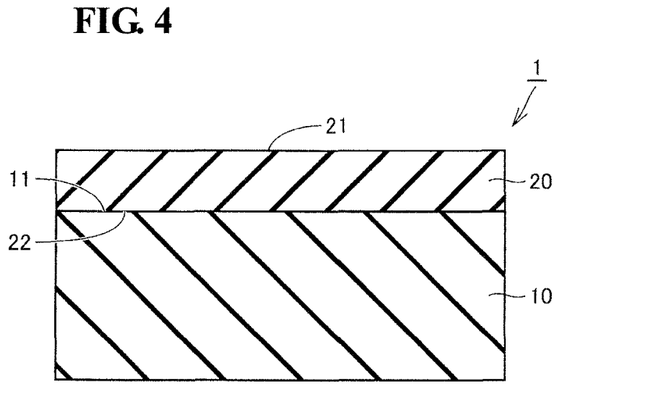
FIG. 4 is a schematic sectional view for describing the method for producing a layered body and a SAW device.

Next, a method for producing a SAW device including the layered body 1 will be described. Referring to FIG. 2, a thickness decreasing step is performed as a step (S70) after the step (S60). In the step (S70), as illustrated in FIG. 1 and FIG. 4, the thickness of the piezoelectric substrate 20 of the layered body 1 obtained in the step (S60) is decreased. Specifically, for example, an exposed main surface 21 of the piezoelectric substrate 20 is subjected to grinding treatment. Thus, the thickness of the piezoelectric substrate 20 is decreased to a thickness suitable for SAW devices.

Figure 5:
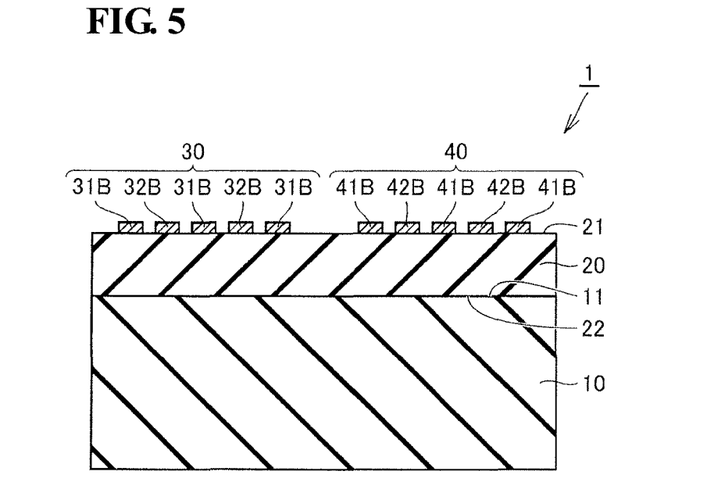
FIG. 5 is a schematic sectional view for describing the method for producing a layered body and a SAW device.
Figure 6:
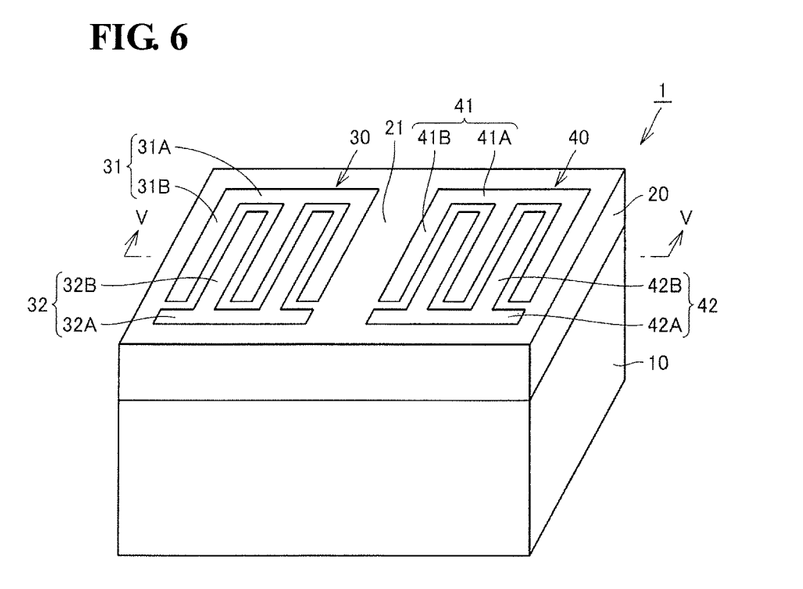
FIG. 6 is a schematic view for describing the method for producing a layered body and a SAW device.

Subsequently, an electrode forming step is performed as a step (S80). In the step (S80), as illustrated in FIG. 4 to FIG. 6, comb-shaped electrodes are formed on the exposed main surface 21 of the piezoelectric substrate 20. FIG. 5 is a sectional view taken along line V-V in FIG. 6. Specifically, as illustrated in FIG. 5 and FIG. 6, a conductive film made of a conductor such as Al is formed on the exposed main surface 21 of the piezoelectric substrate 20 whose thickness has been appropriately adjusted in the step (S70). The conductive film can be formed by, for example, a sputtering method. A resist is then applied onto the conductive film to form a resist film. By performing exposure and development, an opening is formed in a region other than regions corresponding to desired shapes of an input-side electrode 30 and an output-side electrode 40. For example, wet etching is performed using the resist film having the opening formed therein as a mask to form a plurality of pairs of input-side electrodes 30 and output-side electrodes 40 as illustrated in FIG. 5 and FIG. 6. FIG. 5 and FIG. 6 illustrate a region corresponding to a pair of input-side electrode 30 and output-side electrode 40. The electrode interval of the comb-shaped electrodes in the input-side electrode 30 and the output-side electrode 40 can be appropriately determined in accordance with the frequency of signals to be output.

Subsequently, a chip forming step is performed as a step (S90). In the step (S90), the layered body 1 on which a plurality of pairs of input-side electrodes 30 and output-side electrodes 40 have been formed is cut in a thickness direction into a plurality of chips each including a pair of input-side electrode 30 and output-side electrode 40.

Figure 7:
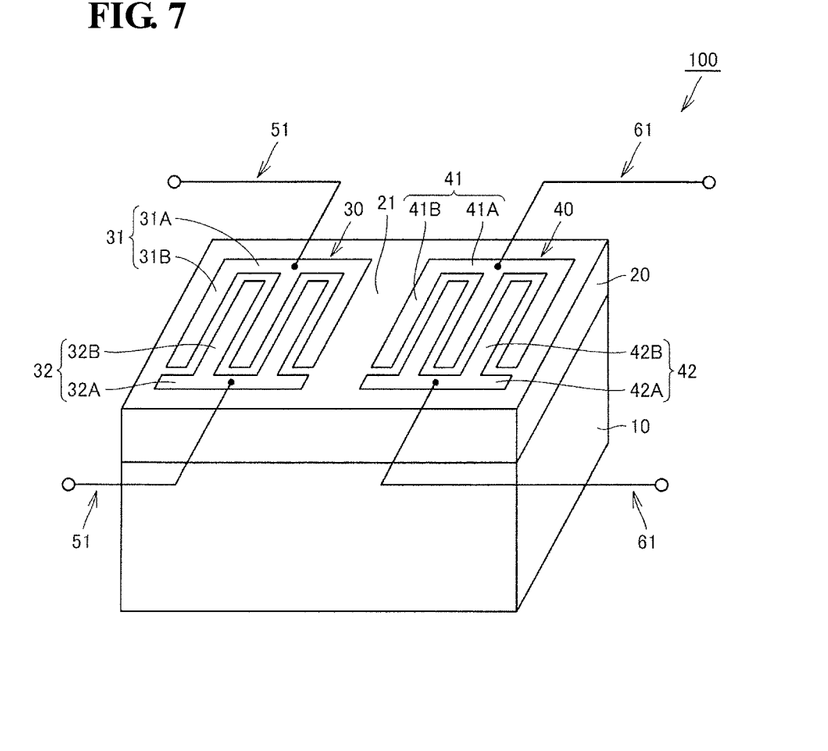
FIG. 7 is a schematic view illustrating a structure of a SAW device.

Referring to FIG. 6 and FIG. 7, an input-side wiring line 51 and an output-side wiring line 61 are then formed on the chip produced in the step (S90) to complete a SAW device 100 (SAW filter) according to a first this embodiment.

Referring to FIG. 7, the SAW device 100 according to this embodiment includes the layered body 1 including the base substrate 10 and the piezoelectric substrate 20 bonded to each other through Van der Waals force, the input-side electrode 30 and the output-side electrode 40, which are a pair of comb-shaped electrodes formed so as to be in contact with the exposed main surface 21 of the piezoelectric substrate 20, the input-side wiring line 51 connected to the input-side electrode 30, and the output-side wiring line 61 connected to the output-side electrode 40.

The input-side electrode 30 includes a first portion 31 and a second portion 32. The first portion 31 includes a linear base 31A and a plurality of linear protrusions 31B that protrude from the base 31A in a direction perpendicular to the direction in which the base 31A extends. The second portion 32 includes a linear base 32A that extends in parallel with the base 31A and a plurality of linear protrusions 32B that protrude from the base 32A in a direction perpendicular to the direction in which the base 32A extends and that fit into gaps between adjacent protrusions 31B. The protrusions 31B and the protrusions 32B are disposed at predetermined evenly spaced intervals.

The output-side electrode 40 includes a first portion 41 and a second portion 42. The first portion 41 includes a linear base 41A and a plurality of linear protrusions 41B that protrude from the base 41A in a direction perpendicular to the direction in which the base 41A extends. The second portion 42 includes a linear base 42A that extends in parallel with the base 41A and a plurality of linear protrusions 42B that protrude from the base 42A in a direction perpendicular to the direction in which the base 42A extends and that fit into gaps between adjacent protrusions 41B. The protrusions 41B and the protrusions 42B are disposed at predetermined evenly spaced intervals.

When an AC voltage serving as an input signal is applied from the input-side wiring line 51 to the input-side electrode 30, a surface acoustic wave is generated on the exposed main surface 21 (surface) of the piezoelectric substrate 20 because of a piezoelectric effect, and the surface acoustic wave propagates to the output-side electrode 40. Herein, the input-side electrode 30 and the output-side electrode 40 have a comb shape as illustrated in FIG. 7, and the protrusions 31B and the protrusions 32B are evenly spaced and the protrusions 41B and the protrusions 42B are evenly spaced. Thus, in a direction from the input-side electrode 30 toward the output-side electrode 40, regions in which electrodes are formed on the exposed main surface 21 of the piezoelectric substrate 20 are present at a predetermined period (electrode period). Therefore, the surface acoustic wave generated by the input signal is excited most when its wavelength is concordant with the electrode period, and is attenuated as the difference between the wavelength and the electrode period increases. Consequently, only a signal with a wavelength close to the electrode period is output through the output-side electrode 40 and the output-side wiring line 61.

In the above operation, the temperature of the piezoelectric substrate 20 increases. In the SAW device 100 according to this embodiment, the piezoelectric substrate 20 is disposed so as to be in contact with the base substrate 10, which is made of a material having good heat dissipation properties. Therefore, the SAW device 100 has high reliability. Furthermore, in the SAW device 100 according to this embodiment, the piezoelectric substrate 20 and the base substrate 10 are bonded to each other with sufficient bonding strength. Accordingly, the SAW device 100 is a highly reliable device.

EXAMPLES

An experiment was conducted to investigate the roughness of the supporting main surface of the base substrate in the layered body and the relationship between the state of projections and depressions present on the supporting main surface and the bonding strength. The experiment was conducted by the following method.

Base substrates 10 formed of polycrystalline spinel were provided, and SAW devices were produced through the same procedure as in the above embodiment (Examples A, B, and C). A base substrate 10 formed of polycrystalline alumina and a base substrate 10 formed of polycrystalline mullite were provided, and SAW devices were produced in the same manner (Examples D and E). For comparison, base substrates formed of polycrystalline spinel were provided, and SAW devices were produced in the same manner except for the step (S50) (Comparative Examples A to F). Base substrates formed of polycrystalline alumina were provided, and SAW devices were produced in the same manner except for the step (S50) (Comparative Examples G and H). Base substrates formed of polycrystalline mullite were provided, and SAW devices were produced in the same manner except for the step (S50) (Comparative Examples I and J). Before bonding with a piezoelectric substrate, Sa (arithmetic mean roughness), Sq (root mean square height), and Sz (maximum height) of the supporting main surface of the base substrate were measured. Furthermore, the number of projections and depressions with a height of 1 nm or more and less than 2 nm in a square region with 50 μm sides, the number of projections and depressions with a height of 2 nm or more and less than 3 nm, and the number of projections and depressions with a height of 3 nm or more were checked. The roughness and the number of projections and depressions were measured at two positions near the center and periphery of the supporting main surface. After bonding, the bonding state was checked and the bonding strength was measured. The bonding strength was measured by a crack opening method. Table 1 shows the experimental results of Examples in which the base substrate formed of polycrystalline spinel was employed. Table 2 shows the experimental results of Comparative Examples in which the base substrate formed of polycrystalline spinel was employed. Table 3 shows the experimental results of Example and Comparative Examples in which the base substrate formed of polycrystalline alumina was employed. Table 4 shows the experimental results of Example and Comparative Examples in which the base substrate formed of polycrystalline mullite was employed. In the lowermost rows of Tables 1 to 4, "Good" was given when the electrode forming step and the chip forming step could be satisfactorily performed, and "Poor" was given when separation occurred in the layered body in the electrode forming step and the chip forming step.

TABLE 1

|  | Example A | | Example B | | Example C | |
| --- | --- | --- | --- | --- | --- | --- |
|  | Center | Periphery | Center | Periphery | Center | Periphery |
| Sa (nm) | 0.281 | 0.264 | 0.215 | 0.240 | 0.278 | 0.198 |
| Sq (nm) | 0.353 | 0.336 | 0.270 | 0.296 | 0.350 | 0.264 |
| Sz (nm) | 2.474 | 8.837 | 1.971 | 2.015 | 3.247 | 5.513 |
| Number of projections and depressions with a height of 1 nm or more and less than 2 nm | 1 | 0 | 0 | 0 | 2 | 0 |
| Number of projections and depressions with a height of 2 nm or more and less than 3 nm | 0 | 0 | 0 | 0 | 0 | 0 |
| Number of projections and depressions with a height of 3 nm or more | 0 | 0 | 0 | 0 | 0 | 0 |
| Bonding state | Entirely bonded | | Entirely bonded | | Entirely bonded | |
| Bonding strength (J/m²) | 1.9 | | 2.0 | | 1.9 | |
| Electrode forming step Chip forming step | Good | | Good | | Good | |

TABLE 2

|  | Comparative Example A | | Comparative Example B | | Comparative Example C | | Comparative Example D | | Comparative Example E | | Comparative Example F | |
| --- | --- | --- | --- | --- | --- | --- | --- | --- | --- | --- | --- | --- |
|  | Center | Periphery | Center | Periphery | Center | Periphery | Center | Periphery | Center | Periphery | Center | Periphery |
| Sa (nm) | 2.256 | 2.987 | 0.425 | 0.436 | 0.486 | 0.563 | 1.187 | 0.694 | 1.043 | 0.787 | 0.721 | 0.885 |
| Sq (nm) | 3.131 | 3.707 | 0.539 | 0.564 | 0.608 | 0.736 | 1.784 | 0.882 | 1.340 | 1.104 | 0.903 | 1.105 |
| Sz (nm) | 30.479 | 38.394 | 6.721 | 5.703 | 4.654 | 10.832 | 14.945 | 7.520 | 10.557 | 15.168 | 6.499 | 10.902 |
| Number of projections and depressions with a height of 1 nm or more and less than 2 nm | 5 | 5 | 5 | 8 | 8 | 9 | 3 | 5 | 10 | 7 | 7 | 8 |
| Number of projections and depressions with a height of 2 nm or more and less than 3 nm | 4 | 2 | 0 | 0 | 0 | 0 | 1 | 1 | 4 | 1 | 3 | 3 |
| Number of projections and depressions with a height of 3 nm or more | 0 | 1 | 0 | 0 | 0 | 0 | 0 | 1 | 2 | 0 | 0 | 1 |
| Bonding state | Not bonded | | Entirely bonded | | Entirely bonded | | Partly bonded | | Partly bonded | | Partly bonded | |
| Bonding strength (J/m²) | 0 | | 0.4 | | 0.4 | | 0.2 | | 0.2 | | 0.3 | |
| Electrode forming step Chip forming step | — | | Poor | | Poor | | Poor | | Poor | | Poor | |

TABLE 3

|  | Example D | | Comparative Example G | | Comparative Example H | |
| --- | --- | --- | --- | --- | --- | --- |
|  | Center | Periphery | Center | Periphery | Center | Periphery |
| Sa (nm) | 0.290 | 0.330 | 0.533 | 0.520 | 0.949 | 0.770 |
| Sq (nm) | 0.310 | 0.350 | 0.707 | 0.698 | 1.342 | 1.011 |
| Sz (nm) | 3.000 | 4.000 | 13.396 | 11.832 | 16.701 | 7.741 |
| Number of projections and depressions with a height of 1 nm or more and less than 2 nm | 2 | 0 | 6 | 7 | 5 | 9 |
| Number of projections and depressions with a height of 2 nm or more and less than 3 nm | 0 | 0 | 0 | 0 | 0 | 2 |
| Number of projections and depressions with a height of 3 nm or more | 0 | 0 | 0 | 0 | 0 | 0 |
| Bonding state | Entirely bonded | | Entirely bonded | | Partly bonded | |
| Bonding strength (J/m$^2$) | 1.9 | | 0.3 | | 0.2 | |
| Electrode forming step Chip forming step | Good | | Poor | | Poor | |

TABLE 4

|  | Example E | | Comparative Example I | | Comparative Example J | |
| --- | --- | --- | --- | --- | --- | --- |
|  | Center | Periphery | Center | Periphery | Center | Periphery |
| Sa (nm) | 0.233 | 0.239 | 0.428 | 0.662 | 0.991 | 0.931 |
| Sq (nm) | 0.300 | 0.319 | 0.558 | 0.659 | 2.036 | 1.812 |
| Sz (nm) | 3.367 | 2.569 | 8.725 | 10.240 | 6.432 | 8.432 |
| Number of projections and depressions with a height of 1 nm or more and less than 2 nm | 1 | 0 | 7 | 10 | 10 | 8 |
| Number of projections and depressions with a height of 2 nm or more and less than 3 nm | 0 | 0 | 0 | 0 | 2 | 3 |
| Number of projections and depressions with a height of 3 nm or more | 0 | 0 | 0 | 0 | 1 | 1 |
| Bonding state | Entirely bonded | | Entirely bonded | | Not bonded | |
| Bonding strength (J/m$^2$) | 1.8 | | 0.4 | | 0 | |
| Electrode forming step Chip forming step | Good | | Poor | | — | |

Referring to Table 1, in Examples A to C in which the supporting main surface of the base substrate formed of polycrystalline spinel has a roughness of 0.01 nm or more and 3.0 nm or less in terms of Sa, the number of projections and depressions with a height of 1 nm or more in the square region with 50 μm sides on the supporting main surface is less than 5 on average, and the number of projections and depressions with a height of 2 nm or more in the square region is less than 1 on average, a bonding strength of 0.5 J/m$^2$ or more is achieved and good bonding is achieved on the entire main surface. Referring to Table 2, in Comparative Examples A to F, the supporting main surface of the base substrate has a roughness of 0.01 nm or more and 3.0 nm or less in terms of Sa, but the bonding strength is low and a good bonding state is not achieved. This may be because the number of projections and depressions with a height of 1 nm or more in the square region with 50 μm sides was 5 or more on average in Comparative Examples A to F, and the number of projections and depressions with a height of 2 nm or more in the square region with 50 μm sides was 1 or more on average in Comparative Examples A, D, E, and F.

Referring to Table 3, in Example D in which the supporting main surface of the base substrate formed of polycrystalline alumina has a roughness of 0.01 nm or more and 3.0 nm or less in terms of Sa, the number of projections and depressions with a height of 1 nm or more in the square region with 50 μm sides on the supporting main surface is less than 5 on average, and the number of projections and depressions with a height of 2 nm or more in the square region is less than 1 on average, a bonding strength of 0.5 J/m$^2$ or more is achieved and good bonding is achieved on the entire main surface. In Comparative Examples G and H, the supporting main surface of the base substrate has a roughness of 0.01 nm or more and 3.0 nm or less in terms of Sa, but the bonding strength is low and a good bonding state is not achieved. As in the case of the base substrate formed of polycrystalline spinel, this may be because the number of projections and depressions with a height of 1 nm or more in the square region with 50 μm sides was 5 or more on average in Comparative Examples G and H, and the number of projections and depressions with a height of 2 nm or more in the square region with 50 μm sides was 1 or more on average in Comparative Example H.

Referring to Table 4, in Example E in which the supporting main surface of the base substrate formed of polycrystalline mullite has a roughness of 0.01 nm or more and 3.0 nm or less in terms of Sa, the number of projections and depressions with a height of 1 nm or more in the square region with 50 µm sides on the supporting main surface is less than 5 on average, and the number of projections and depressions with a height of 2 nm or more in the square region is less than 1 on average, a bonding strength of 0.5 J/m² or more is achieved and good bonding is achieved on the entire main surface. In Comparative Examples I and J, the supporting main surface of the base substrate has a roughness of 0.01 nm or more and 3.0 nm or less in terms of Sa, but the bonding strength is low and a good bonding state is not achieved. As in the case of the base substrate formed of polycrystalline spinel, this may be because the number of projections and depressions with a height of 1 nm or more in the square region with 50 µm sides was 5 or more on average in Comparative Examples I and J, and the number of projections and depressions with a height of 2 nm or more in the square region was 1 or more on average in Comparative Example J.

It is found from the above experimental results that, according to the layered body of the present application in which the roughness of the supporting main surface is sufficiently decreased in terms of arithmetic mean roughness and furthermore the number of large projections and depressions present on the supporting main surface in some rare cases is decreased, a layered body including a piezoelectric substrate and a base substrate bonded to each other with sufficient bonding strength is obtained.

The embodiments and Examples disclosed herein are mere examples in all respects and should be understood as being non-limitative in any perspective. The scope of the present invention is defined not by the above description but by Claims. The scope of the present invention is intended to embrace all the modifications within the meaning and range of equivalency of the Claims.

REFERENCE SIGNS LIST 1 layered body
10 base substrate
100 SAW device
11 supporting main surface
20 piezoelectric substrate
21 exposed main surface
22 bonding main surface
30 input-side electrode
31 first portion
31A base
31B protrusion
32 second portion
32A base
32B protrusion
40 output-side electrode
41 first portion
41A base
41B protrusion
42 second portion
42A base
42B protrusion
51 input-side wiring line
61 output-side wiring line

The invention claimed is:

1. A ceramic substrate formed of a polycrystalline ceramic and having a supporting main surface,
wherein the supporting main surface has a roughness of 0.01 nm or more and 3.0 nm or less in terms of Sa, and
a number of projections and depressions with a height of 1 nm or more in a square region with 50 µm sides on the supporting main surface is less than 5 on average, and a number of projections and depressions with a height of 2 nm or more in the square region is less than 1 on average.

2. The ceramic substrate according to claim 1, wherein the supporting main surface has a roughness of 0.5 nm or less in terms of Sq.

3. The ceramic substrate according to claim 1, wherein the polycrystalline ceramic is made of at least one material selected from the group consisting of spinel, alumina, magnesia, silica, mullite, cordierite, calcia, titania, silicon nitride, aluminum nitride, and silicon carbide.

4. A layered body comprising:
the ceramic substrate according to claim 1; and
a piezoelectric substrate disposed on the supporting main surface and formed of a piezoelectric body,
wherein the ceramic substrate and the piezoelectric substrate are bonded to each other through Van der Waals force.

5. The layered body according to claim 4, wherein bonding strength between the ceramic substrate and the piezoelectric substrate is 0.5 J/m² or more.

6. A SAW device comprising:
the layered body according to claim 4; and
an electrode formed on a main surface of the piezoelectric substrate, the main surface being located opposite to the ceramic substrate.

* * * * *